United States Patent
Lin et al.

(10) Patent No.: US 11,961,810 B2
(45) Date of Patent: Apr. 16, 2024

(54) SOLDERLESS INTERCONNECTION STRUCTURE AND METHOD OF FORMING SAME

(71) Applicant: Taiwan Semiconductor Manufacturing Co., Ltd., Hsinchu (TW)

(72) Inventors: Yu-Wei Lin, New Taipei (TW); Sheng-Yu Wu, Hsinchu (TW); Yu-Jen Tseng, Hsinchu (TW); Tin-Hao Kuo, Hsinchu (TW); Chen-Shien Chen, Zhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 241 days.

(21) Appl. No.: 17/352,844

(22) Filed: Jun. 21, 2021

(65) Prior Publication Data
US 2021/0313287 A1    Oct. 7, 2021

Related U.S. Application Data

(60) Continuation of application No. 16/436,626, filed on Jun. 10, 2019, now Pat. No. 11,043,462, which is a
(Continued)

(51) Int. Cl.
*H01L 21/48*     (2006.01)
*H01L 21/768*    (2006.01)
(Continued)

(52) U.S. Cl.
CPC .......... *H01L 24/02* (2013.01); *H01L 21/4853* (2013.01); *H01L 21/76885* (2013.01);
(Continued)

(58) Field of Classification Search
CPC .......... H01L 21/4853; H01L 21/76855; H01L 23/49811; H01L 24/02; H01L 24/05;
(Continued)

(56) References Cited

U.S. PATENT DOCUMENTS 4,258,382 A    3/1981   Harris
4,536,421 A    8/1985   Matsuzawa et al.
(Continued)

FOREIGN PATENT DOCUMENTS

CN     101080138 A    11/2007
CN     101188219 A    5/2008
(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Fazli Erdem
(74) *Attorney, Agent, or Firm* — Slater Matsil, LLP

(57) ABSTRACT

An embodiment bump on trace (BOT) structure includes a contact element supported by an integrated circuit, an under bump metallurgy (UBM) feature electrically coupled to the contact element, a metal ladder bump mounted on the under bump metallurgy feature, the metal ladder bump having a first tapering profile, and a substrate trace mounted on a substrate, the substrate trace having a second tapering profile and coupled to the metal ladder bump through direct metal-to-metal bonding. An embodiment chip-to-chip structure may be fabricated in a similar fashion.

20 Claims, 5 Drawing Sheets

Related U.S. Application Data continuation of application No. 15/351,184, filed on Nov. 14, 2016, now Pat. No. 10,319,691, which is a division of application No. 13/744,361, filed on Jan. 17, 2013, now Pat. No. 9,496,233.

(60) Provisional application No. 61/707,442, filed on Sep. 28, 2012, provisional application No. 61/707,609, filed on Sep. 28, 2012, provisional application No. 61/707,644, filed on Sep. 28, 2012, provisional application No. 61/702,624, filed on Sep. 18, 2012.

(51) Int. Cl.
*H01L 23/00* (2006.01)
*H01L 23/498* (2006.01)
*H01L 25/00* (2006.01)
*H01L 25/065* (2023.01)

(52) U.S. Cl.
CPC ............ *H01L 24/11* (2013.01); *H01L 24/13* (2013.01); *H01L 24/16* (2013.01); *H01L 24/81* (2013.01); *H01L 25/0657* (2013.01); *H01L 25/50* (2013.01); *H01L 23/49811* (2013.01); *H01L 24/05* (2013.01); *H01L 24/14* (2013.01); *H01L 2224/02125* (2013.01); *H01L 2224/02141* (2013.01); *H01L 2224/02145* (2013.01); *H01L 2224/0215* (2013.01); *H01L 2224/0401* (2013.01); *H01L 2224/05114* (2013.01); *H01L 2224/05124* (2013.01); *H01L 2224/05147* (2013.01); *H01L 2224/05155* (2013.01); *H01L 2224/05647* (2013.01); *H01L 2224/10125* (2013.01); *H01L 2224/11013* (2013.01); *H01L 2224/11019* (2013.01); *H01L 2224/1112* (2013.01); *H01L 2224/11462* (2013.01); *H01L 2224/11472* (2013.01); *H01L 2224/13005* (2013.01); *H01L 2224/13012* (2013.01); *H01L 2224/13015* (2013.01); *H01L 2224/13017* (2013.01); *H01L 2224/13023* (2013.01); *H01L 2224/13026* (2013.01); *H01L 2224/1308* (2013.01); *H01L 2224/13082* (2013.01); *H01L 2224/13083* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13551* (2013.01); *H01L 2224/13564* (2013.01); *H01L 2224/13565* (2013.01); *H01L 2224/1357* (2013.01); *H01L 2224/13582* (2013.01); *H01L 2224/136* (2013.01); *H01L 2224/13686* (2013.01); *H01L 2224/1369* (2013.01); *H01L 2224/14051* (2013.01); *H01L 2224/16148* (2013.01); *H01L 2224/16227* (2013.01); *H01L 2224/16238* (2013.01); *H01L 2224/16503* (2013.01); *H01L 2224/81007* (2013.01); *H01L 2224/81143* (2013.01); *H01L 2224/81191* (2013.01); *H01L 2224/81203* (2013.01); *H01L 2224/81424* (2013.01); *H01L 2224/81439* (2013.01); *H01L 2224/81444* (2013.01); *H01L 2224/81447* (2013.01); *H01L 2224/8181* (2013.01); *H01L 2224/81895* (2013.01); *H01L 2224/8192* (2013.01); *H01L 2224/81948* (2013.01); *H01L 2225/06513* (2013.01); *H01L 2924/04941* (2013.01); *H01L 2924/07025* (2013.01); *H01L 2924/181* (2013.01); *H01L 2924/301* (2013.01); *H01L 2924/35* (2013.01); *Y10T 29/49144* (2015.01)

(58) Field of Classification Search
CPC ......... H01L 24/11; H01L 24/13; H01L 24/14; H01L 24/16; H01L 24/81; H01L 25/0657; H01L 25/50
USPC ........................................................ 257/737
See application file for complete search history.

(56) References Cited

U.S. PATENT DOCUMENTS

| | | |
|---|---|---|
| 4,811,082 A | 3/1989 | Jacobs et al. |
| 4,830,723 A | 5/1989 | Galvagni et al. |
| 4,990,462 A | 2/1991 | Sliwa, Jr. |
| 5,075,253 A | 12/1991 | Sliwa, Jr. |
| 5,075,965 A | 12/1991 | Carey et al. |
| 5,130,779 A | 7/1992 | Agarwala et al. |
| 5,134,460 A | 7/1992 | Brady et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,492,266 A | 2/1996 | Hoebener et al. |
| 5,508,561 A | 4/1996 | Tago et al. |
| 5,542,601 A | 8/1996 | Fallon et al. |
| 5,565,379 A | 10/1996 | Baba |
| 5,587,337 A | 12/1996 | Idaka et al. |
| 5,680,187 A | 10/1997 | Nagayama et al. |
| 5,743,006 A | 4/1998 | Beratan |
| 5,790,377 A | 8/1998 | Schreiber et al. |
| 5,796,591 A | 8/1998 | Dalal et al. |
| 5,796,592 A | 8/1998 | Tanaka |
| 5,816,478 A | 10/1998 | Kaskoun et al. |
| 5,889,326 A | 3/1999 | Tanaka |
| 5,922,496 A | 7/1999 | Dalal et al. |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,051,273 A | 4/2000 | Dalal et al. |
| 6,082,610 A | 7/2000 | Shangguan et al. |
| 6,091,141 A | 7/2000 | Heo |
| 6,099,935 A | 8/2000 | Brearley et al. |
| 6,130,476 A | 10/2000 | LaFontaine, Jr. et al. |
| 6,137,184 A | 10/2000 | Ikegami |
| 6,181,010 B1 | 1/2001 | Nozawa |
| 6,187,678 B1 | 2/2001 | Gaynes et al. |
| 6,229,216 B1 | 5/2001 | Ma et al. |
| 6,229,220 B1 | 5/2001 | Saitoh et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,259,159 B1 | 7/2001 | Dalal et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,326,241 B1 * | 12/2001 | Belke, Jr. ............ H01L 21/563 257/E21.511 |
| 6,336,262 B1 | 1/2002 | Dalal et al. |
| 6,344,234 B1 | 2/2002 | Dalal et al. |
| 6,346,469 B1 | 2/2002 | Greer |
| 6,355,501 B1 | 3/2002 | Fung et al. |
| 6,358,847 B1 | 3/2002 | Li et al. |
| 6,388,322 B1 | 5/2002 | Goossen et al. |
| 6,424,037 B1 | 7/2002 | Ho et al. |
| 6,426,556 B1 | 7/2002 | Lin |
| 6,434,016 B2 | 8/2002 | Zeng et al. |
| 6,448,661 B1 | 9/2002 | Kim et al. |
| 6,461,895 B1 | 10/2002 | Liang et al. |
| 6,469,394 B1 | 10/2002 | Wong et al. |
| 6,475,897 B1 | 11/2002 | Hosaka |
| 6,476,503 B1 | 11/2002 | Imamura |
| 6,492,197 B1 | 12/2002 | Rinne |
| 6,498,308 B2 | 12/2002 | Sakamoto |
| 6,562,653 B1 | 5/2003 | Ma et al. |

(56) References Cited

U.S. PATENT DOCUMENTS

| | | |
|---|---|---|
| 6,562,657 B1 | 5/2003 | Lin |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,586,323 B1 * | 7/2003 | Fan ................ H01L 24/11 257/E23.021 |
| 6,592,019 B2 | 7/2003 | Tung |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta |
| 6,731,003 B2 | 5/2004 | Joshi et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,192,803 B1 | 3/2007 | Lin et al. |
| 7,215,033 B2 | 5/2007 | Lee et al. |
| 7,245,023 B1 | 7/2007 | Lin |
| 7,251,484 B2 | 7/2007 | Aslanian |
| 7,271,483 B2 | 9/2007 | Lin et al. |
| 7,271,484 B2 | 9/2007 | Reiss et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |
| 7,569,935 B1 | 8/2009 | Fan |
| 7,576,435 B2 | 8/2009 | Chao |
| 7,659,631 B2 | 2/2010 | Kamins et al. |
| 7,714,235 B1 | 5/2010 | Pedersen et al. |
| 7,804,177 B2 | 9/2010 | Lu et al. |
| 7,834,450 B2 | 11/2010 | Kang |
| 7,939,939 B1 | 5/2011 | Zeng et al. |
| 7,946,331 B2 | 5/2011 | Trezza et al. |
| 8,026,128 B2 | 9/2011 | Pendse |
| 8,076,232 B2 | 12/2011 | Pendse |
| 8,093,729 B2 | 1/2012 | Trezza |
| 8,120,175 B2 | 2/2012 | Farooq et al. |
| 8,130,475 B2 | 3/2012 | Kawamori et al. |
| 8,158,489 B2 | 4/2012 | Huang et al. |
| 8,207,604 B2 | 6/2012 | Haba et al. |
| 8,232,640 B2 | 7/2012 | Tomoda et al. |
| 8,258,055 B2 | 9/2012 | Hwang et al. |
| 8,313,213 B2 | 11/2012 | Lin et al. |
| 8,367,939 B2 | 2/2013 | Ishido |
| 8,435,881 B2 | 5/2013 | Choi et al. |
| 8,536,458 B1 | 9/2013 | Darveaux et al. |
| 8,576,368 B2 | 11/2013 | Kim et al. |
| 8,823,166 B2 | 9/2014 | Lin et al. |
| 9,105,530 B2 | 8/2015 | Lin et al. |
| 9,355,980 B2 | 5/2016 | Chen et al. |
| 9,425,136 B2 | 8/2016 | Kuo et al. |
| 9,496,233 B2 | 11/2016 | Lin et al. |
| 9,583,687 B2 | 2/2017 | Hwang |
| 9,991,224 B2 | 6/2018 | Yu et al. |
| 10,510,710 B2 | 12/2019 | Yu et al. |
| 2001/0013423 A1 | 8/2001 | Dalal et al. |
| 2001/0038147 A1 | 11/2001 | Higashi et al. |
| 2002/0033412 A1 | 3/2002 | Tung |
| 2002/0084528 A1 | 7/2002 | Kim et al. |
| 2002/0100974 A1 | 8/2002 | Uchiyama |
| 2002/0106832 A1 | 8/2002 | Hotchkiss et al. |
| 2002/0197811 A1 | 12/2002 | Sato |
| 2003/0049886 A1 | 3/2003 | Salmon |
| 2003/0092219 A1 | 5/2003 | Ouchi et al. |
| 2003/0094963 A1 | 5/2003 | Fang |
| 2003/0166331 A1 | 9/2003 | Tong et al. |
| 2003/0216025 A1 | 11/2003 | Lu et al. |
| 2003/0218250 A1 | 11/2003 | Kung et al. |
| 2003/0233133 A1 | 12/2003 | Greenberg et al. |
| 2004/0004284 A1 | 1/2004 | Lee et al. |
| 2004/0007779 A1 | 1/2004 | Arbuthnot et al. |
| 2004/0140538 A1 | 7/2004 | Harvey |
| 2004/0159944 A1 | 8/2004 | Datta et al. |
| 2004/0166661 A1 | 8/2004 | Lei |
| 2004/0212098 A1 | 10/2004 | Pendse |
| 2004/0251546 A1 | 12/2004 | Lee et al. |
| 2005/0017376 A1 | 1/2005 | Tsai |
| 2005/0062153 A1 | 3/2005 | Saito et al. |
| 2005/0158900 A1 | 7/2005 | Lee |
| 2005/0212114 A1 | 9/2005 | Kawano et al. |
| 2005/0224991 A1 | 10/2005 | Yeo |
| 2005/0253264 A1 | 11/2005 | Aiba et al. |
| 2005/0277283 A1 | 12/2005 | Lin et al. |
| 2006/0012024 A1 | 1/2006 | Lin et al. |
| 2006/0017160 A1 | 1/2006 | Huang |
| 2006/0038303 A1 | 2/2006 | Sterrett et al. |
| 2006/0051954 A1 | 3/2006 | Lin et al. |
| 2006/0055032 A1 | 3/2006 | Chang et al. |
| 2006/0076677 A1 | 4/2006 | Daubenspeck et al. |
| 2006/0209245 A1 | 9/2006 | Mun et al. |
| 2006/0223313 A1 | 10/2006 | Yoon et al. |
| 2006/0279881 A1 | 12/2006 | Sato |
| 2006/0292824 A1 | 12/2006 | Beyne et al. |
| 2007/0001280 A1 | 1/2007 | Hua |
| 2007/0012337 A1 | 1/2007 | Hillman et al. |
| 2007/0018294 A1 | 1/2007 | Sutardja |
| 2007/0020906 A1 | 1/2007 | Chiu et al. |
| 2007/0023483 A1 * | 2/2007 | Yoneyama ............ B23K 20/10 228/110.1 |
| 2007/0045840 A1 | 3/2007 | Varnau |
| 2007/0057022 A1 | 3/2007 | Mogami et al. |
| 2007/0114663 A1 | 5/2007 | Brown et al. |
| 2007/0200234 A1 | 8/2007 | Gerber et al. |
| 2008/0003402 A1 | 1/2008 | Haba et al. |
| 2008/0003715 A1 | 1/2008 | Lee |
| 2008/0023850 A1 | 1/2008 | Lu et al. |
| 2008/0087998 A1 | 4/2008 | Kamins |
| 2008/0128911 A1 | 6/2008 | Koyama |
| 2008/0150135 A1 | 6/2008 | Oyama et al. |
| 2008/0169544 A1 | 7/2008 | Tanaka et al. |
| 2008/0180376 A1 | 7/2008 | Kim et al. |
| 2008/0194095 A1 | 8/2008 | Daubenspeck et al. |
| 2008/0217047 A1 | 9/2008 | Hu |
| 2008/0218061 A1 | 9/2008 | Chao et al. |
| 2008/0277785 A1 | 11/2008 | Hwan et al. |
| 2009/0025215 A1 | 1/2009 | Murakami et al. |
| 2009/0042144 A1 | 2/2009 | Kitada et al. |
| 2009/0045499 A1 | 2/2009 | Kim et al. |
| 2009/0075469 A1 | 3/2009 | Furman et al. |
| 2009/0087143 A1 | 4/2009 | Jeon |
| 2009/0091024 A1 | 4/2009 | Zeng et al. |

(56) References Cited

U.S. PATENT DOCUMENTS

| | | |
|---|---|---|
| 2009/0096092 A1 | 4/2009 | Patel |
| 2009/0108443 A1 | 4/2009 | Jiang |
| 2009/0146316 A1 | 6/2009 | Jadhav et al. |
| 2009/0149016 A1 | 6/2009 | Park et al. |
| 2009/0166861 A1 | 7/2009 | Lehr et al. |
| 2009/0174067 A1 | 7/2009 | Lin |
| 2009/0218702 A1 | 9/2009 | Beyne et al. |
| 2009/0233436 A1 | 9/2009 | Kim et al. |
| 2009/0250814 A1 | 10/2009 | Pendse et al. |
| 2010/0007019 A1 | 1/2010 | Pendse |
| 2010/0044860 A1 | 2/2010 | Haba et al. |
| 2010/0052473 A1 | 3/2010 | Kimura |
| 2010/0084763 A1 | 4/2010 | Yu |
| 2010/0141880 A1 | 6/2010 | Koito et al. |
| 2010/0193944 A1 | 8/2010 | Castro et al. |
| 2010/0200279 A1 | 8/2010 | Kariya et al. |
| 2010/0252926 A1 | 10/2010 | Kato et al. |
| 2010/0258950 A1 | 10/2010 | Li et al. |
| 2010/0270458 A1 | 10/2010 | Lake et al. |
| 2010/0276787 A1 | 11/2010 | Yu et al. |
| 2010/0314745 A1 | 12/2010 | Masumoto et al. |
| 2010/0327422 A1 | 12/2010 | Lee et al. |
| 2011/0001250 A1 | 1/2011 | Lin et al. |
| 2011/0024902 A1 | 2/2011 | Lin et al. |
| 2011/0038147 A1 | 2/2011 | Lin et al. |
| 2011/0074022 A1 | 3/2011 | Pendse |
| 2011/0084386 A1 | 4/2011 | Pendse |
| 2011/0101519 A1 | 5/2011 | Hsiao et al. |
| 2011/0101526 A1 | 5/2011 | Hsiao et al. |
| 2011/0169158 A1 | 7/2011 | Varanasi |
| 2011/0177686 A1 | 7/2011 | Zeng et al. |
| 2011/0186986 A1 | 8/2011 | Chuang et al. |
| 2011/0193220 A1 | 8/2011 | Kuo et al. |
| 2011/0227219 A1 | 9/2011 | Alvarado et al. |
| 2011/0244675 A1 | 10/2011 | Huang et al. |
| 2011/0248399 A1 | 10/2011 | Pendse |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007230 A1 | 1/2012 | Hwang et al. |
| 2012/0007231 A1 | 1/2012 | Chang |
| 2012/0007232 A1 | 1/2012 | Haba |
| 2012/0012997 A1 | 1/2012 | Shen et al. |
| 2012/0025365 A1 | 2/2012 | Haba |
| 2012/0040524 A1 | 2/2012 | Kuo et al. |
| 2012/0049346 A1 | 3/2012 | Lin et al. |
| 2012/0091577 A1 | 4/2012 | Hwang et al. |
| 2012/0098120 A1 | 4/2012 | Yu et al. |
| 2012/0098124 A1 | 4/2012 | Wu et al. |
| 2012/0145442 A1 | 6/2012 | Gupta et al. |
| 2012/0146168 A1 | 6/2012 | Hsieh et al. |
| 2012/0223428 A1 | 9/2012 | Pendse |
| 2012/0306080 A1 | 12/2012 | Yu et al. |
| 2012/0319270 A1* | 12/2012 | Chen .......... H01L 23/562 257/737 |
| 2013/0026622 A1 | 1/2013 | Chuang et al. |
| 2013/0026629 A1 | 1/2013 | Nakano |
| 2013/0087920 A1 | 4/2013 | Jeng et al. |
| 2013/0093079 A1 | 4/2013 | Tu et al. |
| 2013/0181340 A1 | 7/2013 | Uehling et al. |
| 2013/0252418 A1 | 9/2013 | Arvin et al. |
| 2013/0270699 A1 | 10/2013 | Kuo et al. |
| 2013/0277830 A1 | 10/2013 | Yu et al. |
| 2013/0288473 A1 | 10/2013 | Chuang et al. |
| 2013/0307144 A1* | 11/2013 | Yu .......... H01L 25/0657 257/737 |
| 2013/0341785 A1 | 12/2013 | Fu et al. |
| 2014/0048929 A1 | 2/2014 | Cha et al. |
| 2014/0054764 A1 | 2/2014 | Lu et al. |
| 2014/0054769 A1 | 2/2014 | Yoshida et al. |
| 2014/0054770 A1 | 2/2014 | Yoshida et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077359 A1 | 3/2014 | Tsai et al. |
| 2014/0077360 A1 | 3/2014 | Lin et al. |
| 2014/0077365 A1 | 3/2014 | Lin et al. |
| 2014/0117533 A1 | 5/2014 | Lei et al. |
| 2014/0264890 A1 | 9/2014 | Breuer et al. |
| 2014/0346669 A1 | 11/2014 | Wang |
| 2014/0353820 A1 | 12/2014 | Yu et al. |
| 2015/0091160 A1 | 4/2015 | Reber |
| 2015/0171013 A1 | 6/2015 | Liao |
| 2015/0325542 A1 | 11/2015 | Lin et al. |
| 2016/0190090 A1 | 6/2016 | Yu et al. |
| 2016/0254240 A1 | 9/2016 | Chen |
| 2016/0329293 A1 | 11/2016 | Cha et al. |
| 2017/0229421 A1 | 8/2017 | Tseng et al. |

FOREIGN PATENT DOCUMENTS

| | | |
|---|---|---|
| CN | 102254871 A | 11/2011 |
| CN | 102386158 A | 3/2012 |
| CN | 102456651 A | 5/2012 |
| CN | 102468197 A | 5/2012 |
| CN | 102543898 A | 7/2012 |
| EP | 1387402 A2 | 2/2004 |
| KR | 1020110002816 A | 1/2011 |
| KR | 1020110128532 A | 11/2011 |
| TW | 200826265 A | 6/2008 |
| TW | 200915452 A | 4/2009 |
| TW | 201133662 A1 | 10/2011 |
| TW | 201143007 A | 12/2011 |
| WO | 2009140238 A3 | 11/2009 |

* cited by examiner

SOLDERLESS INTERCONNECTION STRUCTURE AND METHOD OF FORMING SAME

PRIORITY CLAIM AND CROSS-REFERENCE

This application is a continuation application of U.S. patent application Ser. No. 16/436,626, filed Jun. 10, 2019, entitled "Solderless Interconnection Structure and Method of Forming Same," which is a continuation application of U.S. patent application Ser. No. 15/351,184, filed Nov. 14, 2016, entitled "Solderless Interconnection Structure and Method of Forming Same," now U.S. Pat. No. 10,319,691, issued on Jun. 11, 2019, which is a divisional application of U.S. patent application Ser. No. 13/744,361, filed Jan. 17, 2013, entitled "Interconnection Structure and Method of Forming Same," now U.S. Pat. No. 9,496,233, issued on Nov. 15, 2016, which application claims the benefit of U.S. Provisional Application No. 61/707,609, filed on Sep. 28, 2012, entitled "Interconnection Structure Method of Forming Same," of U.S. Provisional Application No. 61/707,644, filed on Sep. 28, 2012, entitled "Metal Bump and Method of Manufacturing Same," of U.S. Provisional Application No. 61/702,624, filed on Sep. 18, 2012, entitled "Ladd Bump Structures and Methods of Making the Same," and of U.S. Provisional Application No. 61/707,442, filed on Sep. 28, 2012, entitled "Bump Structure and Method of Forming Same," which applications are hereby incorporated herein by reference.

BACKGROUND

Generally, the conventional flip chip bumps have vertical or nearly vertical sidewalls and are connected to an underlying trace (such as on a substrate, a printed circuit board, an interposer, another chip, or the like) using a solder reflow process.

The solder joint method forms intermetallic compounds (IMCs) between the metal-solder interface. The IMCs may cause higher electrical resistivity (contact resistance). The higher electrical resistivity leads to increased electromigration, which further increases the contact resistance. In addition, with a small area under bump metallurgy (UBM), the solder/metal electromigration issue may be of greater concern.

As device packaging dimensions shrink, the smaller distance between the bump and an adjacent trace may lead to undesirable bridging during reflow. In addition, as device packaging dimensions shrink interconnect bump sizes also shrink. The reduction in bump size has led to an increase in interconnect resistance and capacitance (RC) that is the cause of signal transmission delay (RC delay). Smaller bump sizes also increases the risk of extremely low-k (ELK) dielectric delamination.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a ladder bump structure for a bump on trace (BOT) assembly or a flip-chip chip scale package (FCCSP). The concepts in the disclosure may also apply, however, to other semiconductor structures or circuits.

Figure 1:
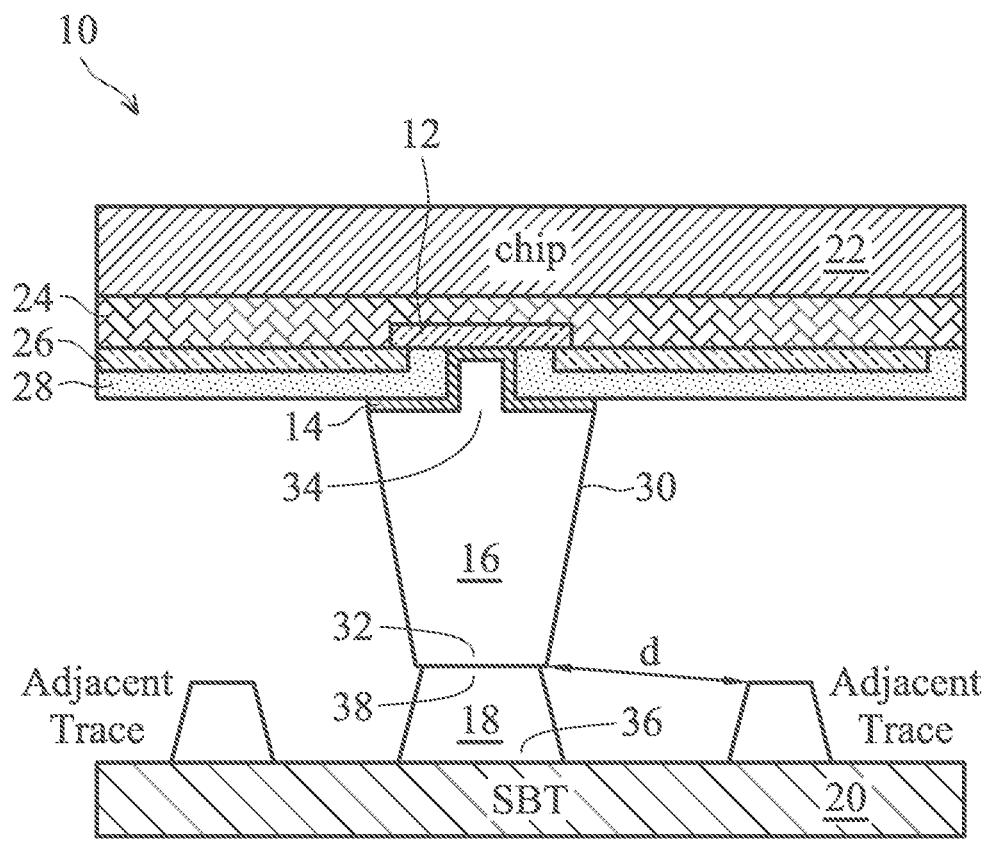
FIG. 1 is a cross sectional view of an embodiment bump on trace (BOT) structure.

Referring now to FIG. 1, an embodiment bump on trace (BOT) structure 10 is illustrated. As shown, the BOT structure 10 includes a contact element 12, an under bump metallurgy (UBM) feature 14, a metal ladder bump 16, a substrate trace 18, and a substrate (SBT) 20. As shown, the contact element 12 is generally supported by the integrated circuit 22 (i.e., chip). In an embodiment, an insulating layer 24 is disposed between the contact element 12 and the integrated circuit 22. In an embodiment, the contact element 12 is an aluminum pad. In an embodiment, the insulating layer 24 comprises an extremely low-k (ELK) dielectric.

In an embodiment, a passivation layer 26 overlies the integrated circuit 22 (and/or the insulating layer 24). As shown in FIG. 1, the passivation layer 26 may have a passivation opening exposing the contact element 12. In an embodiment, a polyimide layer 28 overlies the passivation layer 26. The polyimide layer 28 may have a polyimide opening exposing the contact element 12.

Various layers and features of the integrated circuit 22, including transistors, interconnect layers, post passivation interconnects, redistribution layers, and the like are omitted from the figures for the sake of clarity, as they are not necessary to an understanding of the present disclosure.

Still referring to FIG. 1, the UBM feature 14 is electrically coupled to the contact element 12. In an embodiment, the UBM feature 14 is formed from titanium (Ti), titanium nitride (TiN) copper nickel (CuNi), aluminum (Al), and the like to a thickness of, perhaps, about 0.1 µm to about 5 µm, depending on the application. As shown, various layers including, for example, a passivation layer and a polyimide layer, may be disposed between portions of the UBM feature 14 and the contact element 12.

Still referring to FIG. 1, the metal ladder bump 16 is mounted on the UBM feature 14. In an embodiment, the metal ladder bump 16 has a tapering profile. In an embodiment, the metal ladder bump 16 has a linear tapering profile. Indeed, the metal ladder bump 16 generally has the shape of a truncated cone. In an embodiment, sidewalls 30 of the metal ladder bump 16 are linear from a distal end 32 to a mounted end 34 of the metal ladder bump 16 along an entire height (i.e., or length) of the sidewalls 30 of the metal ladder bump 16.

In an embodiment, the metal ladder bump 16 is formed from a suitable material such as, for example, copper (Cu), nickel (Ni), gold (Au), palladium (Pd), titanium (Ti), and so on, or alloys thereof. The mounted end 34 of the metal ladder bump 16, which is the end closest to the integrated circuit 22, has a greater width than the distal end 32 of the metal ladder bump 16, which is the end furthest from the integrated circuit 22. In an embodiment, the distal end 32 has a width of between about 10 µm to about 80 µm. In an embodiment, the mounted end 34 has a width of between about 20 µm to about 90 µm.

From the foregoing, it should be recognized that the mounted end 34 is wider or larger than the distal end 32. This condition may be satisfied by, for example, making the mounted end 34 of the metal ladder bump 16 larger relative to the distal end 32. This condition may also be satisfied by, for example, making the distal end 32 of the metal ladder bump 16 smaller relative to the mounted end 34.

One skilled in the art will recognize that it is not desirable to increase the pitch between adjacent bumps. This means that the width of the distal end 32 should not be increased beyond design dimensions. Hence, in order to get the truncated cone structure for the metal ladder bump 16, the width of the mounted end 34 should be increased in order to obtain the advantageous structure. The wider width of the mount end 34 may also serve to lessen the possibility of delamination between the metal ladder bump 16 and adjacent layers and may also serve to lessen stress impact on underlying layers such as underlying ELK layers (e.g., insulating layer 24). As shown in FIG. 1, by forming the distal end 32 of the metal ladder bump 16 smaller than the mounted end 34, the distance, d, between the adjacent trace 18 and the bonded substrate trace 18/metal bump 16 is greater to prevent bridging.

In an embodiment, a photolithography process is used to shape the metal ladder bump 16 as shown in FIG. 1. Indeed, in the photolithography process a photoresist may be shaped appropriately in order to produce the metal ladder bump 16 in the form illustrated in FIG. 1. In an embodiment, the metal ladder bump 16 and/or the substrate trace 18 may be formed using an electrolytic plating process.

Still referring to FIG. 1, the substrate trace 18 is generally mounted on the substrate 20. In an embodiment, the substrate trace 18 is formed from copper (Cu), nickel (Ni), gold (Au), aluminum (Al), silver (Ag), and so on, or alloys thereof. As shown, the substrate trace 18 also has a tapering profile. Indeed, a mounted end 36 of the substrate trace 18, which is the end mounted to the substrate 20, has a greater width than a distal end 38 of the substrate trace 18, which is the end furthest from the substrate 20.

In addition to the above, the substrate trace 18 is structurally and electrically coupled to the metal ladder bump 16 through direct metal-to-metal bonding. Indeed, ends of the metal ladder bump 16 and the substrate trace 18 are each free of solder. Because direct metal-to-metal bonding is used instead of solder, the metal ladder bump 16 is operably coupled to the substrate trace without forming any undesirably intermetallic compounds at or proximate the bonded joint. In addition, the absence of solder reduces the potential for undesirably bridging of the substrate trance 18 and/or the metal ladder bump 16 with an adjacent substrate trace 18.

In an embodiment, the direct metal-to-metal bonding process includes several steps. For example, the top portions or surfaces of the metal ladder bump 16 and/or substrate trace 18 are appropriately cleaned to remove debris or contaminants that may detrimentally affect bonding or bonding strength. Thereafter, the metal ladder bump 16 and the substrate trace 18 are aligned with each other. Once aligned, a permanent bonding process such as, for example, a thermo-compression bonding is performed to bond the metal ladder bump 16 to the substrate trace 18. In an embodiment, an annealing step may be performed to increase the bond strength. For example, the metal ladder bump 16 and the substrate trace 18 may be subjected to a temperature of about 100° C. to about 400° C. for about 1 hour to about 2 hours.

Figure 2:
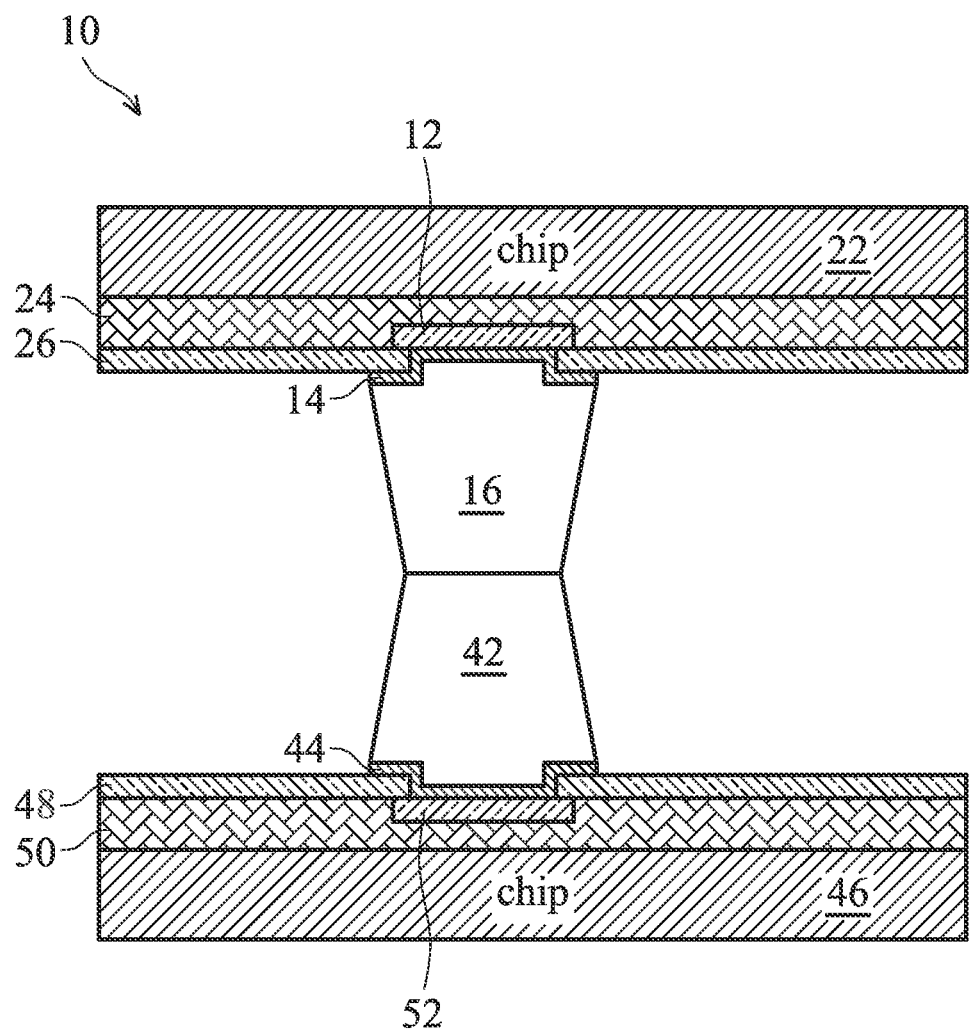
FIG. 2 is a cross sectional view of an embodiment chip-to-chip structure.

Referring now to FIG. 2, an embodiment chip-to-chip structure 40 is illustrated. The chip-to-chip structure 40 is similar to the BOT structure 10 of FIG. 1. However, the chip-to-chip structure 40 of FIG. 2 includes a second metal ladder bump 42 mounted on a second UBM feature 44 of a second integrated circuit 46 instead of the substrate trace 18 on the substrate 20. As shown, the second metal ladder bump 42 also has a tapering profile and is structurally and electrically coupled to the first metal ladder bump 16 through direct metal-to-metal bonding.

In an embodiment, the second integrated circuit 46 includes a second passivation layer 48, a second insulating layer 50 (e.g., ELK dielectric), and a second contact element 52 (e.g., aluminum pad). Various layers and features of the second integrated circuit 46, including transistors, interconnect layers, post passivation interconnects, redistribution layers, and the like are omitted from the figures for the sake of clarity, as they are not necessary to an understanding of the present disclosure. In addition, the second metal ladder bump 42 may be formed in similar fashion and with similar dimensions relative to the metal ladder bump 16 of FIG. 1.

Figure 3:
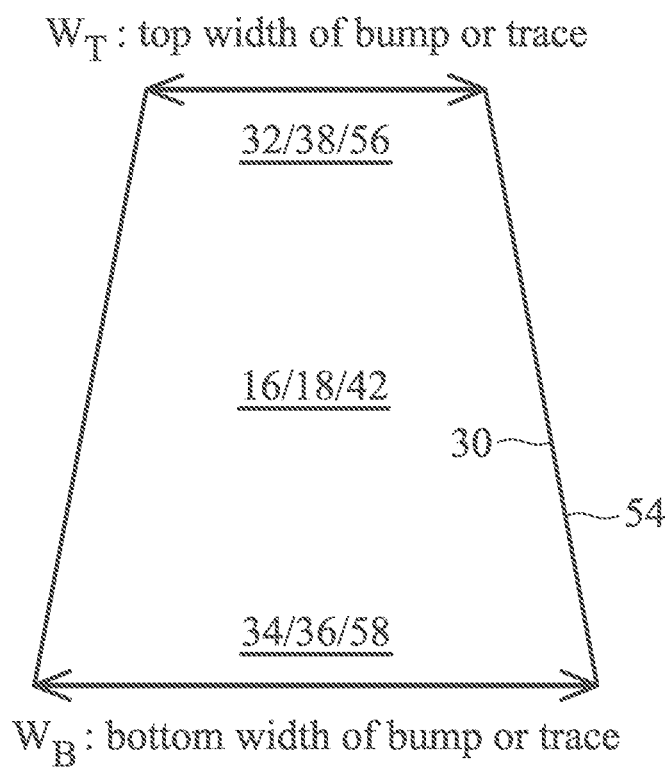
FIG. 3 is a cross section of a metal bump from the BOT structure of FIG. 1 or the chip-to-chip structure of FIG. 2 illustrating a tapering profile and a metal oxide formed on sidewalls.

As shown in FIG. 3, in an embodiment a metal oxide 54 (e.g., cupric oxide, CuO, cuprous oxide, $Cu_2O$, aluminum oxide, $Al_2O_3$, etc.) is formed on the sidewalls 30 of the metal ladder bump 16, substrate trace 18, or second metal ladder bump 42. In an embodiment, a ratio of the width ($W_T$) of the distal end 32 of the metal ladder bump 16 to the width ($W_B$) of the mounted end 34 of the metal ladder bump 16 is between about 0.75 to about 0.97. In an embodiment, a ratio of the width ($W_T$) of the distal end 38 of the substrate trace 18 to the width ($W_B$) of the mounted end 36 of the substrate trace 18 is between about 0.75 to about 0.97. In an embodiment, a ratio of the width ($W_T$) of the distal end 56 of the second metal ladder bump 42 to the width ($W_B$) of the mounted end 58 of the second metal ladder bump 42 is between about 0.75 to about 0.97.

Figure 4:
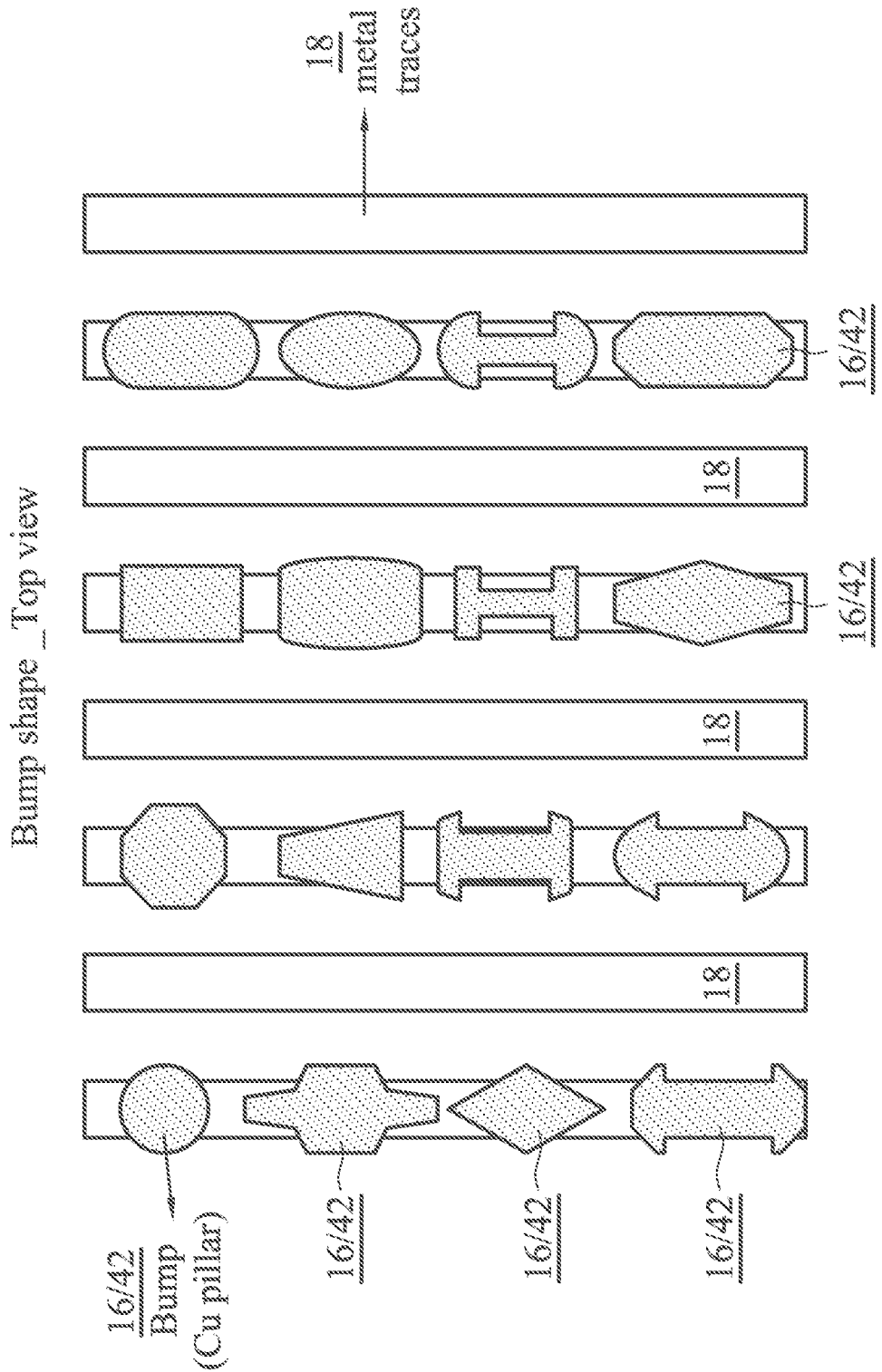
FIG. 4 is a plan view of the metal bump from the BOT structure of FIG. 1 or the chip-to-chip structure of FIG. 2 illustrating various periphery shapes.

As shown in FIG. 4, a periphery of the metal ladder bump 16 (or the second metal ladder bump 42) may take or resemble a variety of different shapes when viewed from above. In an embodiment, the metal ladder bump 16 (or the second metal ladder bump 42) is in the form of a circle, a rectangle, an ellipse, an obround, a hexagon, an octagon, a trapezoid, a diamond, a capsule, and combinations thereof when viewed from the mounted end 34, 58. In FIG. 4, the periphery of the metal ladder bump 16 (or the second metal ladder bump 42) is shown relative to the underlying metal substrate trace 18 (FIG. 1).

One skilled in the art will recognize that the specific dimensions for the various widths and spacing discussed herein are matters of design choice and are dependent upon the particular technology node, and application employed.

Figure 5:
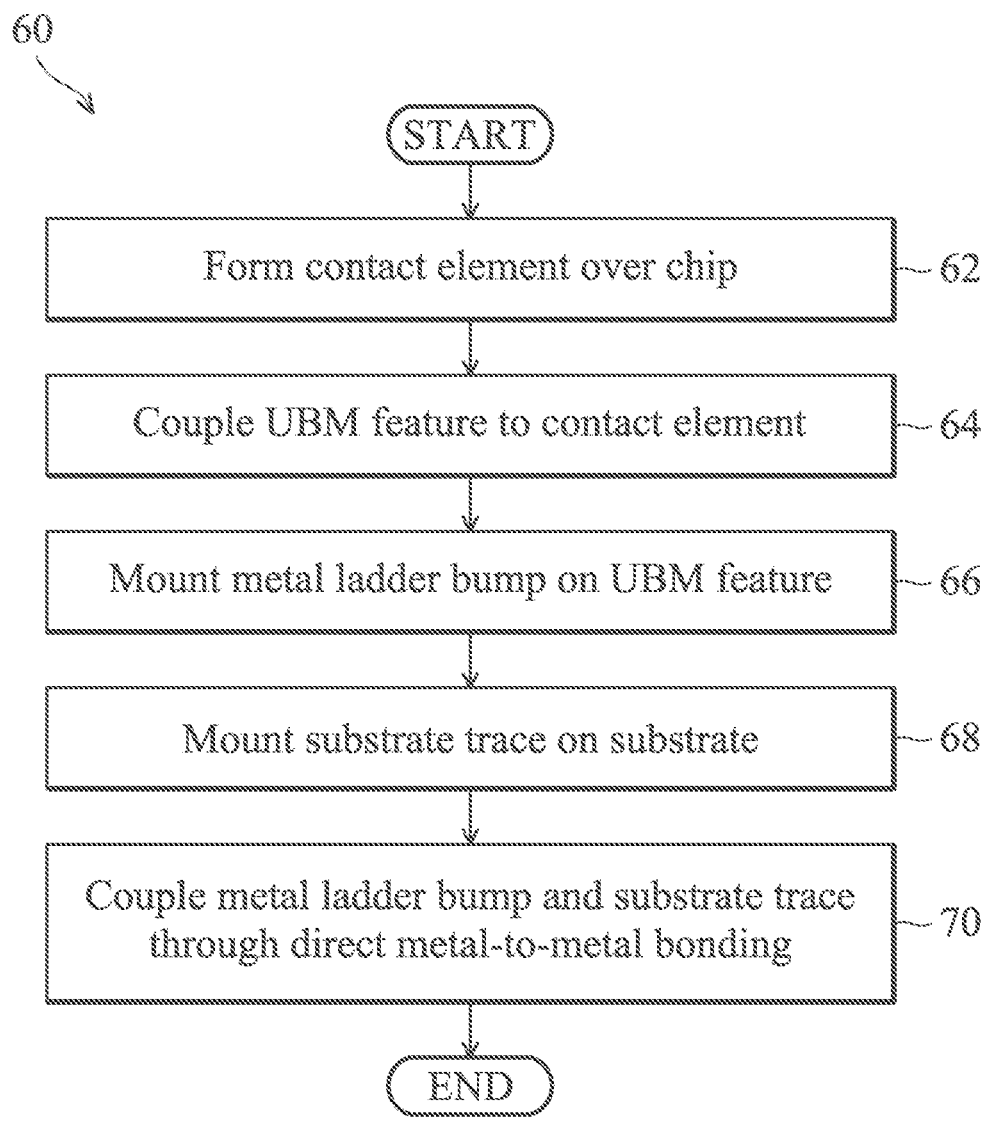
FIG. 5 is a method of forming the BOT structure of FIG. 1.

Referring now to FIG. 5, an embodiment method 60 of forming the BOT structure 10 of FIG. 1 is provided. In block

62, the contact element 12 is formed on the integrated circuit 22. In block 64, the UBM feature is electrically coupled to the contact element 12. Then, in block 66, the metal ladder bump 16 with the tapering profile is mounted on the UBM feature 14. In block 68, the substrate trace 18 with the tapering profile is mounted on the substrate 20. Thereafter, in block 70, the metal ladder bump 16 and the substrate trace 18 are coupled together through direct metal-to-metal bonding as described herein. Those skilled in the art will recognize that the chip-to-chip structure of FIG. 2 may be formed in similar fashion. Therefore, a detailed description of such a method has not been repeated herein for the sake of brevity.

From the foregoing it should be recognized that embodiment BOT structure 10 and chip-to-chip structure 40 provide advantageous features. For example, without having to rely on solder bonding, the BOT structure 10 and chip-to-chip structure 40 are free of any undesirably intermetallic compounds (IMCs). In addition, the BOT structure 10 and chip-to-chip structure 40 provide lower electrical resistivity, lower risk of electromigration failure, and a significantly reduced interconnect RC delay relative to conventional devices. Moreover, the structures 10, 40 inhibit or prevent delamination of the insulating layer 24, 46 (the ELK dielectric). In addition, the smaller top surface area of the metal ladder bump 16, substrate trace 18, and/or second metal ladder bump 42 provide for easier bonding. Still further, the bonding time and the interfacial seam voids may be reduced using the structures 10, 40 and methods disclosed herein.

The following references are related to subject matter of the present application. Each of these references is incorporated herein by reference in its entirety:

U.S. Publication No. 2011/0285023 of Shen, et al. filed on Nov. 24, 2011, entitled "Substrate Interconnections Having Different Sizes."

An embodiment bump on trace (BOT) structure includes a contact element supported by an integrated circuit, an under bump metallurgy (UBM) feature electrically coupled to the contact element, a metal ladder bump mounted on the under bump metallurgy feature, the metal ladder bump having a first tapering profile, and a substrate trace mounted on a substrate, the substrate trace having a second tapering profile and coupled to the metal ladder bump through direct metal-to-metal bonding.

An embodiment chip-to-chip structure includes a first contact element supported by a first integrated circuit, a first under bump metallurgy (UBM) feature electrically coupled to the first contact element, a first metal ladder bump mounted on the first under bump metallurgy feature, the first metal ladder bump having a first tapering profile, and a second metal ladder bump mounted on a second under bump metallurgy feature of a second integrated circuit, the second metal ladder bump having a second tapering profile and coupled to the second metal ladder bump through direct metal-to-metal bonding.

An embodiment method of forming a bump on trace (BOT) structure includes forming a contact element on an integrated circuit, electrically coupling an under bump metallurgy (UBM) feature to the contact element, mounting a metal ladder bump on the under bump metallurgy feature, the metal ladder bump having a first tapering profile, mounting a substrate trace on a substrate, the substrate trace having a second tapering profile, and coupling the metal ladder bump and the substrate trace together through direct metal-to-metal bonding.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
   a trace extending along a substrate by a first length, the trace having a first end mounted to the substrate and having a second end distal to the first end, the first end having a first width, the second end having a second width, the first length greater than the first width and the second width; and
   a chip comprising:
   an integrated circuit;
   an insulating layer on the integrated circuit;
   a contact pad in the insulating layer;
   a passivation layer on the contact pad and the insulating layer;
   a polyimide layer on the passivation layer and in physical contact with the contact pad;
   an under bump metallurgy extending through the polyimide layer and the passivation layer, the under bump metallurgy coupled to the contact pad;
   a bump having a third end mounted to the under bump metallurgy and having a fourth end distal to the third end, the third end having a third width, the fourth end having a fourth width, the fourth width less than the third width, wherein the second end of the trace is directly bonded to the fourth end of the bump, the second end of the trace and the fourth end of the bump being free of solder and of intermetallic compounds; and
   an oxide layer disposed on an entirety of a first sidewall of the bump, the first sidewall extending from the third end to the fourth end.

2. The device of claim 1, wherein the second width is less than the first width.

3. The device of claim 1, wherein the bump has a second length, the first length greater than the second length.

4. The device of claim 1, wherein sidewalls of the bump taper linearly from the third end to the fourth end.

5. The device of claim 1, wherein the insulating layer comprises an extremely low-k dielectric.

6. The device of claim 1, wherein the trace has a first periphery shape, the bump has a second periphery shape, and the second periphery shape is different from the first periphery shape.

7. The device of claim 1, wherein the oxide layer comprises a metal oxide.

8. A device comprising:
   a metal trace extending along a major surface of a first substrate, the metal trace having a first end mounted to the first substrate and having a second end distal to the first end, the first end having a greater width than the second end; and
   a metal bump extending from a second substrate, the metal bump having a third end mounted to the second substrate and having a fourth end distal to the third end, the third end having a greater width than the fourth end, wherein the metal bump and the metal trace are physically and electrically coupled together through direct metal-to-metal bonds, an interface between the metal bump and the metal trace being free of solder, and wherein the metal trace has a greater length than the metal bump in a direction parallel to the major surface of the first substrate; and a first oxide layer disposed on an entirety of a sidewall of the metal bump, wherein the sidewall extends from the third end to the fourth end.

9. The device of claim 8, wherein a first periphery of the second end of the metal trace has a first shape, and a second periphery of the fourth end of the metal bump has a second shape, the second shape different from the first shape.

10. The device of claim 8, wherein the interface between the metal bump and the metal trace is free of intermetallic compounds.

11. The device of claim 8, wherein sidewalls of the metal bump taper linearly from the third end to the fourth end.

12. The device of claim 11 further comprising:
a second oxide layer on the sidewalls of the metal trace.

13. The device of claim 8 further comprising:
an insulating layer on the second substrate;
a contact pad in the insulating layer;
a passivation layer on the contact pad and the insulating layer; and
an under bump metallurgy extending through the passivation layer, the under bump metallurgy coupled to the contact pad,
wherein the metal bump is disposed on the under bump metallurgy.

14. The device of claim 13, wherein the insulating layer comprises an extremely low-k dielectric.

15. The device of claim 8, wherein the fourth end of the metal bump has a greater width than the second end of the metal trace.

16. A device comprising:
a metal trace mounted on a first substrate, the metal trace having a first width, the metal trace extending along a surface of the first substrate by a first length, the first length greater than the first width; and
a chip comprising:
a contact pad over a second substrate;
an insulating layer surrounding the contact pad;
a polyimide layer over the contact pad and the insulating layer;
an under bump metallurgy over the polyimide layer, the contact pad, and the insulating layer; and
a metal bump mounted over the second substrate and on the under bump metallurgy, the metal bump having a second width, the second width decreasing along a second direction extending from the second substrate to the first substrate, wherein the under bump metallurgy isolates the metal bump from the polyimide layer, and wherein the metal bump and the metal trace are physically and electrically coupled together without solder.

17. The device of claim 16, wherein the first width decreases along a first direction extending from the first substrate to the second substrate.

18. The device of claim 16, wherein the first width is less than the second width at an interface of the metal bump and the metal trace.

19. The device of claim 16, wherein the metal bump has a second length, the second length greater than the second width.

20. The device of claim 19, wherein the first length is greater than the second length.

* * * * *